(12) United States Patent
Katori

(10) Patent No.: US 6,479,849 B1
(45) Date of Patent: *Nov. 12, 2002

(54) DIELECTRIC CAPACITOR AND MEMORY AND METHOD OF MANUFACTURING THE SAME

(75) Inventor: Kenji Katori, Kanagawa (JP)

(73) Assignee: Sony Corporation (JP)

( * ) Notice: Subject to any disclaimer, the term of this patent is extended or adjusted under 35 U.S.C. 154(b) by 8 days.

This patent is subject to a terminal disclaimer.

(21) Appl. No.: 09/583,913

(22) Filed: May 31, 2000

(30) Foreign Application Priority Data

Jun. 2, 1999 (JP) .............................. 11-155390

(51) Int. Cl.⁷ ............................................ H01L 31/119
(52) U.S. Cl. ..................... 257/296; 257/306; 257/310
(58) Field of Search ................. 257/295, 296, 257/306, 307, 308, 310

(56) References Cited

U.S. PATENT DOCUMENTS 5,691,219 A * 11/1997 Kawakubo et al. .. 148/DIG. 14
5,807,774 A * 9/1998 Desu et al. .................. 438/240
6,011,284 A * 1/2000 Katori et al. ................ 257/295
6,049,103 A * 4/2000 Horikawa et al. ........... 257/303
6,307,731 B1 * 10/2001 Katori ......................... 361/305

FOREIGN PATENT DOCUMENTS

JP     10-242409     9/1998

* cited by examiner

Primary Examiner—Trung Dang
(74) Attorney, Agent, or Firm—Rader, Fishman, & Grauer PLLC; Ronald P. Kananen, Esq.

(57) ABSTRACT

A bottom electrode, a dielectric film and a top electrode are sequentially provided on a substrate portion. The bottom electrode comprises an adhesive layer including IrHf, a precious metal layer including Ir, an oxygen inclusion layer including IrHfO, and a precious metal layer including Ir in sequence on the substrate portion. At the time of forming dielectric film, RTA (Rapid thermal annealing) is performed and thereafter inert gas thermal annealing is performed at a temperature equal to or higher than that in RTA, or reduction thermal annealing, thereby preventing deterioration of characteristics which occurs through hydrogen annealing. Moreover, the precious metal layer is provided between the adhesive layer and the oxygen inclusion layer. Therefore, adhesion of the bottom electrode is secured even though inert gas thermal annealing or reduction thermal annealing is performed in order to prevent deterioration of characteristics.

11 Claims, 5 Drawing Sheets

DIELECTRIC CAPACITOR AND MEMORY AND METHOD OF MANUFACTURING THE SAME

BACKGROUND OF THE INVENTION

1. Field of the Invention

The present invention relates to a dielectric capacitor, in which a first electrode and a second electrode are connected to a dielectric film, respectively, a memory and a method of manufacturing the same.

2. Description of the Related Art

A ferroelectric memory is a rapidly rewritable, non-volatile memory by means of rapid polarization inversion and its residual polarization of a ferroelectric film. Conventionally, as a ferroelectric memory, a memory in which a dielectric capacitor and a transistor are arranged in parallel to the direction along which a base surface extends is known for example. In such a ferroelectric memory, for example, the dielectric capacitor has a construction in which an adhesive layer made of titanium (Ti), a bottom electrode layer made of platinum (Pt), a ferroelectric film made of a bismuth (Bi) inclusion layer structure oxide or PZT which is a solid solution of $PbTi_3$ and $PbZrO_3$, and a top electrode layer made of platinum are stacked successively on a base sandwiching an insulating layer in between. It is difficult for microfabrication to be performed on platinum, so a precious metal other than platinum can be used for the bottom electrode layer and the tope electrode layer.

Further, in order to increase information recording density, a so-called stack type capacitor in which a transistor and a ferroelectric capacitor are placed so as to be stacked on the base is known. In the ferroelectric memory, for example, the transistor and the bottom electrode of the ferroelectric capacitor are electrically coupled through a plug layer made of silicon (Si) and also an anti-diffusion layer for preventing diffusion of a chemical element on the bottom electrode of the ferroelectric capacitor is provided. The anti-diffusion layer is for preventing conductivity of the bottom electrode from being lost when silicon is diffused from the plug layer onto the bottom electrode and oxidized in the top layer portion. The anti-diffusion layer is also for preventing a capacitor characteristic from being significantly deteriorated when the silicon is diffused onto the ferroelectric film. Both are caused by thermal annealing at a high temperature of approximately 600–800° C. in forming the ferroelectric film. As such a ferroelectric memory, for example, a ferroelectric memory in which the anti-diffusion layer including iridium (Ir), hafnium (Hf), and oxygen (O) is formed in the bottom electrode and the ferroelectric film is composed of layer structure oxide consisting of strontium (Sr), bismuth, tantalum (Ta) and oxygen has been conventionally reported (Refer to Japanese Unexamined Patent Application Publication No. Hei 10-242409.)

However, in the conventional ferroelectric memory, when the common MOS (Metal-Oxide-Semiconductor) type memory structure is employed, hydrogen annealing at a temperature of 400–500° C., which is performed for recovering functionality of a transistor before the metal wiring process, deteriorates characteristics of a ferroelectric capacitor. This is considered to be because when precious metal other than platinum or gold (Au) is used for the bottom electrode including the anti-diffusion layer, precious metal oxide which has been produced through thermal annealing at the time of forming the ferroelectric film is reduced by hydrogen annealing and therefore composition or the like of the ferroelectric film significantly changes.

Therefore, it is considered that deterioration of the ferroelectric capacitor can be prevented by performing thermal treatment or the like in a nitrogen gas atmosphere prior to hydrogen annealing. However, a thus manufactured ferroelectric memory has a problem such that adhesion of the bottom electrode weakens.

SUMMARY OF THE INVENTION

The present invention has been achieved in view of above problems, and it is an object of the present invention to provide a dielectric capacitor and a memory, in which an electrode has good adhesion, and a method of manufacturing the same.

A dielectric capacitor according to the present invention wherein each of a first electrode and a second electrode is connected to a dielectric film is supported by a substrate portion. The first electrode includes an oxygen inclusion layer, which is provided between the substrate portion and the dielectric film including oxygen, a precious metal layer, which is provided between the oxygen inclusion layer and the substrate portion, including at least one selected from a precious metal element group consisting of platinum, iridium, ruthenium, rhodium and palladium and an adhesive layer provided between the precious metal layer and the substrate portion.

In another dielectric capacitor according to the present invention, each of the first electrode and the second electrode is connected to the dielectric film and at least one of the first electrode and the second electrode comprises a layer including an alloy made of at least one selected from a precious metal element group consisting of platinum, iridium, ruthenium, rhodium and palladium, and at least one selected from a transition metal element group consisting of hafnium, tantalum, zirconium, niobium, vanadium, molybdenum, tungsten and a rare-earth element. The composition formula of the alloy is expressed by $M_{IIId}M_{IVe}$, where an element in the precious metal element group is indicated by $M_{III}$ and an element in the transition metal element group is indicated by $M_{IV}$, and its composition range is $97 \geq d \geq 90$, $10 \geq e \geq 3$, $d+e=100$ in atom %.

A memory according to the present invention includes a dielectric capacitor which is supported by the substrate portion and in which each of a first electrode and a second electrode is connected to a dielectric film. The first electrode, which is provided between the substrate portion and the dielectric film, comprises a precious metal layer including at least one selected from a precious metal element group consisting of platinum (Pt), iridium (Ir), ruthenium (Ru), rhodium (Rh) and palladium (Pd), which is provided between the oxygen inclusion layer and the substrate portion, and an adhesive layer provided between the precious metal layer and the substrate portion.

Another memory according to the present invention includes a dielectric capacitor in which each of a first electrode and a second electrode is connected to a dielectric film. At least one of the first electrode and the second electrode comprises a layer including an alloy made of at least one selected from a precious metal element group consisting of platinum (Pt), iridium (Ir), ruthenium (Ru), rhodium (Rh) and palladium (Pd), at least one selected from a transition metal element group consisting of hafnium (Hf), tantalum (Ta), zirconium (Zr), niobium (Nb), vanadium (V), molybdenum (Mo), tungsten (W) and a rare-earth element. The composition formula of the alloy is expressed by $M_{IIId}M_{IVe}$, where an element in the precious metal element group is $M_{III}$ and an element in the transition metal element group is $M_{Iv}$ and its composition range is $97 \geq d \geq 90$, $10 \geq e \geq 3$, d+e=100 in atom %.

A method of manufacturing a dielectric capacitor according to the invention is for manufacturing a dielectric capacitor which is supported by the substrate portion, and in which each of the first electrode and the second electrode is connected to the dielectric film and the first electrode includes an adhesive layer. The step for forming the first electrode in the method of manufacturing a dielectric capacitor according to the invention includes a step of depositing a first layer, which is to construct the adhesive layer, on the substrate portion, a step of depositing a second layer on the first layer, using at least one selected from the precious metal element group consisting of platinum (Pt), iridium (Ir), ruthenium (Ru), rhodium (Rh) and palladium (Pd), and a step of depositing a third layer including oxygen on the second layer.

A method of manufacturing a memory according to the present invention is for manufacturing a memory including a dielectric capacitor which is supported by the substrate portion, and in which each of the first electrode and the second electrode is connected to the dielectric film and the first electrode includes an adhesive layer. The step for forming the first electrode in the method of manufacturing a memory according to the present invention includes a step of depositing a first layer, which is to construct the adhesive layer, on the substrate portion, a step of depositing a second layer on the first layer using at least one selected from the precious metal element group consisting of platinum (Pt), iridium (Ir), ruthenium (Ru), rhodium (Rh) and palladium (Pd), and a step of depositing a third layer including oxygen on the second layer.

A dielectric capacitor according to the present invention includes the adhesive layer including at least one selected from the precious metal element group between the substrate portion and the oxygen inclusion layer, thereby obtaining strong adhesion.

In another dielectric capacitor according to the present invention, at least one of the first electrode and the second electrode is composed so as to comprise a layer including an alloy $M_{IIId}M_{Ive}$ made of at least one selected from the precious metal element group and at least selected one from the transition element group. Thus, strong adhesion is obtained.

A memory according to the present invention comprises the dielectric capacitor of the invention.

In a method of manufacturing a dielectric capacitor according to the invention, the first layer, which is to compose the adhesive layer, is first deposited on the substrate portion, the second layer is then deposited on the first layer using at least one selected from the precious metal element group, and finally the third layer including oxygen is deposited on the second layer.

A method of manufacturing a memory according to the present invention includes steps of the method of manufacturing a dielectric capacitor of the invention.

Other and further objects, features and advantages of the invention will appear more fully from the following description.

DETAILED DESCRIPTION OF THE PREFERRED EMBODIMENTS

Figure 1:
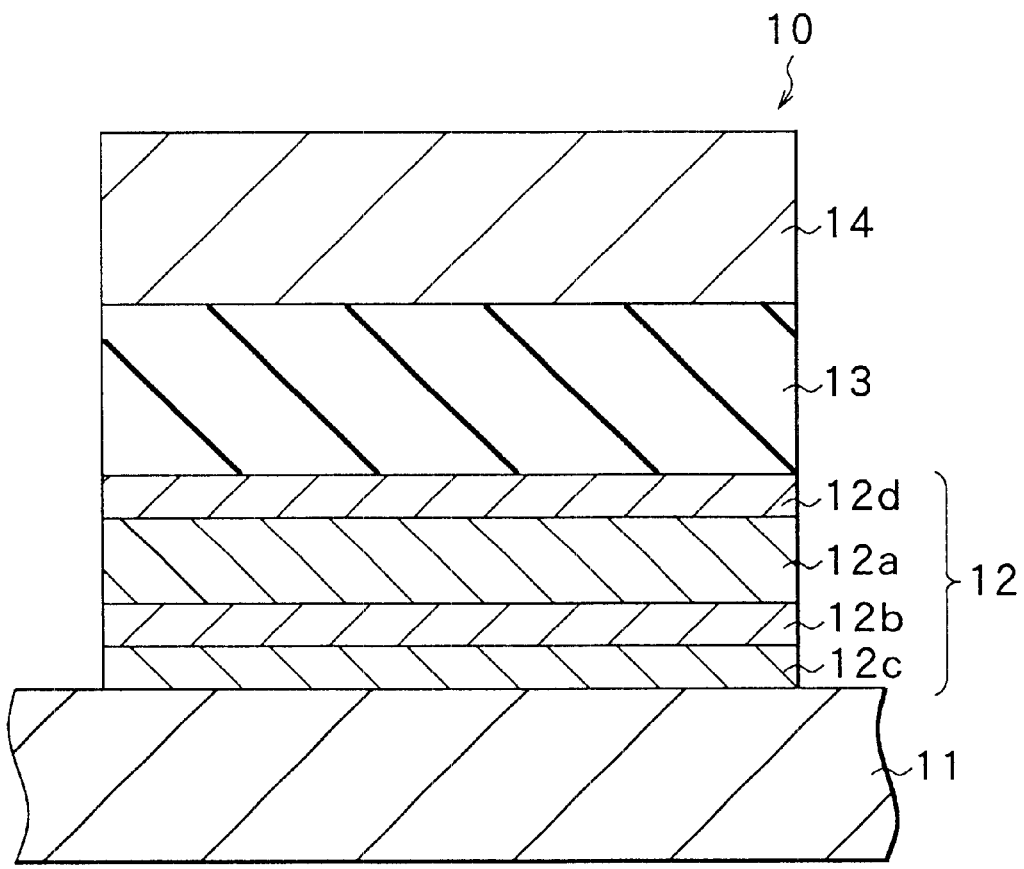
FIG. 1 is a cross section showing a construction of a dielectric capacitor according to the embodiment of the present invention.

The embodiments of this invention will be described in further detail with reference to the accompanying drawings.
First Embodiment FIG. 1 shows a construction of a dielectric capacitor 10 according to a first embodiment of the present invention. The dielectric capacitor 10 is constructed on one surface of a substrate portion 11 made of, for example, silicon, an insulating material such as silicon dioxide ($SiO_2$) or the like by stacking a bottom electrode 12, which is a first electrode, a dielectric film 13, and a top electrode 14, which is a second electrode, in that order on the side of the substrate portion 11. that is, the dielectric capacitor 10 is supported by the substrate portion 11. And the bottom electrode 12 and the tope electrode 14 are connected to the dielectric film 13, respectively.

The bottom electrode 12 includes an oxygen inclusion layer 12a with a thickness of about 100 nm which is provided between the substrate portion 11 and the dielectric film 13, a precious metal layer 12b with a thickness of about 20 nm, which is provided between the oxygen inclusion layer 12a and the substrate portion 11, and an adhesive layer 12c with a thickness of about 20 nm which is provided between the precious metal layer 12b and the substrate portion 11, for example. The bottom electrode 12 also includes, for example, another precious metal layer 12d with a thickness of about 20 nm which is provided between the oxygen inclusion layer 12a and the dielectric film 13.

The oxygen inclusion layer 12a has a function for preventing elements to diffuse between the substrate portion 11 and the dielectric film 13. The oxygen inclusion layer 12a mainly includes, for example, an oxygen inclusion material made of at least one selected from a precious metal element group consisting of platinum, iridium, ruthenium (Ru), rhodium (Rh) and palladium (Pd), at least one selected from a transition metal element group consisting of hafnium, tantalum, zirconium (Zr), niobium (Nb), vanadium (V), molybdenum (Mo), tungsten (W) and a rare earth element, and oxygen. Elements included in the precious metal element group and the transition metal element group are indicated by element symbols in Table 1.

TABLE 1

| | |
|---|---|
| Precious Metal Element Group | Pt, Ir, Ru, Rh, Pd |
| Transition Metal Element Group | Hf, Ta, Zr, Nb, V, Mo, W, rare-earth element |

The composition formula of the oxygen inclusion material is expressed by the Chemical Formula 1 below, where an element in the precious metal element group is indicated by $M_I$ and an element in the transition metal element group is indicated by $M_{II}$, and preferably its composition range is $90 \geq a \geq 4$, $15 \geq b \geq 2$, $c \geq 4$, a+b+c=100 in atom %. When the precious metal element $M_I$ exceeds this range, the stable microlite condition cannot be obtained. When the precious metal element $M_I$ is below the range, it causes larger electrical resistance and the unstable crystal condition. Also, in a case where the composition of the transition metal element $M_{II}$ and oxygen is within the range, the stable microlite condition can be obtained.

$$M_{Ia}M_{IIb}O_c \qquad \text{Chemical Formula 1}$$

$M_I$: an element in the precious metal element group
$M_{II}$: an element in the transition metal element group The precious metal layer 12b has a function for preventing deterioration of the adhesive layer 12c, thereby securing adhesion thereof. For example, the precious metal layer 12b includes mainly at least one selected from the precious metal group shown in Table 1, for example. The precious metal layer 12b may include a precious metal element among elements in the precious metal element group different from the one in the oxygen inclusion layer 12a. However, preferably the precious metal layer 12b is composed so as to include the same precious metal element as that in the oxygen inclusion layer 12a. As a result, it is possible to simplify its manufacturing apparatus, thereby improving productivity.

The adhesive layer 12c for increasing adhesion to the substrate portion 11, mainly includes at least one selected from an composition element group consisting of titanium, zirconium, hafnium, tantalum, niobium, chromium (Cr), molybdenum, and tungsten, for example.

The precious metal layer 12d mainly includes at least one selected from the precious metal element group shown in Table 1, for example. The precious metal layer 12d, in which diffusion of elements is more prone to occur than in the oxygen inclusion layer 12a, has a function to support favorable growth of crystals at the time of forming the dielectric film 13. The precious metal layer 12d may include a precious metal element among elements in the precious metal element group different from that in the oxygen inclusion layer 12a or the precious metal layer 12b. However, in light of its effect on improving productivity, the precious metal layer 12d is preferably composed so as to include the same precious metal element as that in the oxygen inclusion layer 12a or precious metal layer 12b.

The dielectric film 13 is approximately 170 nm in thickness, for example, and is composed of a ferroelectric including mainly layer structure oxide containing bismuth. The inclusion rate of the layer structure oxide therein is preferably 85 vol. % or higher. This is because favorable ferroelectric characteristics cannot be obtained if the inclusion rate is lower than this rate. This layer structure oxide is preferably composed of, for example, bismuth, at least one selected, as a first element, from a group consisting of strontium (Sr), calcium (Ca) and barium (Ba), at least one selected, as a second element, from a group consisting of tantalum (Ta) and niobium (Nb), and oxygen and formulated in the composition formula shown in Chemical Formula 2. Also, its composition range is preferably $2.50 \geq x \geq 1.70$, $1.20 \geq y \geq 0.60$, and $-1.00 \geq z \geq 1.00$ in mole ratio.

$$Bi_x(Sr, Ca, Ba)_x(Ta, Nb)_2O_{9+z} \qquad \text{Chemical Formula 2}$$

It is because favorable ferroelectric characteristics can be obtained from such a layer structure oxide. In view of a stoichiometry composition, its crystal structure of the layer structure oxide is the perovskite type in which a layer corresponding to $[Bi_2O_2]^{2+}$ and a layer corresponding to $[(Sr, Ca, Ba)_1(Ta, Nb)_2O_7]^{2-}$ are stacked alternately.

The top electrode 14 is, for example, about 200 nm thick mainly including at least one selected from the precious metal element group shown in Table 1.

Figure 2:
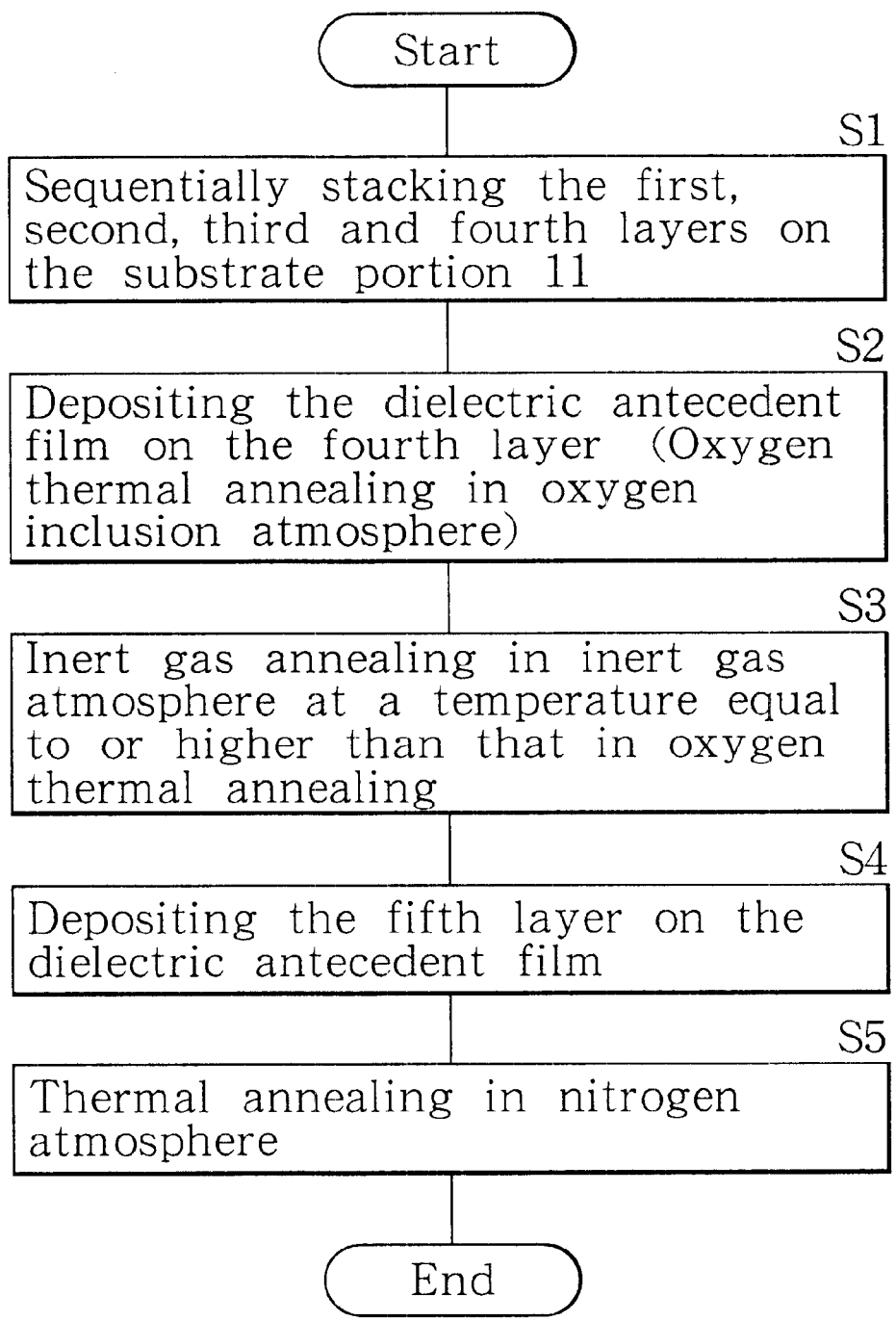
FIG. 2 is a flow chart showing steps of the manufacturing method of the dielectric capacitor shown in FIG. 1.

The dielectric capacitor 10 can be manufactured as follows:

FIG. 2 shows steps of the manufacturing process of the dielectric capacitor 10. First of all, as a step for forming a first electrode, a first layer is deposited approximately 20 nm in thickness by using at least one selected from the adhesive layer composition element group described above on the substrate portion 11 by sputtering, for example. A second layer is deposited approximately 20 nm in thickness by using at least one selected from the precious metal element group described above on the first layer. A third layer including oxygen is deposited about 100 nm in thickness on the second layer using the above described oxygen inclusion material $M_{Ia}M_{IIb}O_c$. A fourth layer is deposited about 20 nm thick using at least one selected from the precious element group on the third layer (Step S1, FIG. 2). Here, the first layer is to comprise the adhesive layer 12c; the second layer is to comprise the precious metal layer 12b; the third layer is to comprise the oxygen inclusion layer 12a; and the fourth layer is to comprise the precious metal layer 12d.

Next, as a step for forming the dielectric film 13, a dielectric antecedent film including the layer structure oxide is deposited on the fourth layer by the sol-gel method, for example (Step S2). Specifically, for example, a sol-gel solution including bismuth and the first and the second elements described above is applied on the fourth layer by the spin-coat method, and, then, rapid thermal annealing (RTA), i.e., oxygen thermal annealing is performed in an oxygen inclusion atmosphere. A part of the first, second, third, and fourth layers is oxidized by the oxygen thermal annealing.

Subsequently, as a step for forming the dielectric film 13, for example, thermal annealing takes place to grow crystals of the dielectric antecedent film (Step S3). At this time, the thermal annealing is performed in an inert gas atmosphere. As the inert gas, either rare gas, such as nitrogen gas ($N_2$), argon (Ar) gas, or helium (He) gas, or mixed gas in which two or more gases among the aforementioned rare gases are mixed, can be used. This treatment prevents deterioration in characteristics of the dielectric film 13, even when hydrogen annealing is performed after this step. This is considered to be because oxide generated in part of the first, second, third, and fourth layers through oxygen thermal annealing in Step S2 is reduced by the inert gas thermal annealing, but not reduced by the hydrogen annealing. Here, the inert gas thermal annealing is preferably performed at a temperature equal to or higher than that in the oxygen thermal annealing in Step 2 in order to sufficiently prevent deterioration in characteristics of the dielectric film 13.

Additionally, the second layer is formed between the first layer and the third layer, using at least one selected from the precious metal element group. Therefore, even when the inert gas thermal annealing takes place, deterioration of the first layer is prevented, thereby securing adhesion.

After the inert gas thermal annealing, a fifth layer to construct a top electrode 14 is deposited about 200 nm thick on the dielectric antecedent film, for example, by sputtering using at least one selected from the precious metal element group (Step S4). Thereafter, thermal annealing takes place in a nitrogen atmosphere (Step S5). Thus, the dielectric capacitor 10 shown in FIG. 1 is formed.

Figure 3:
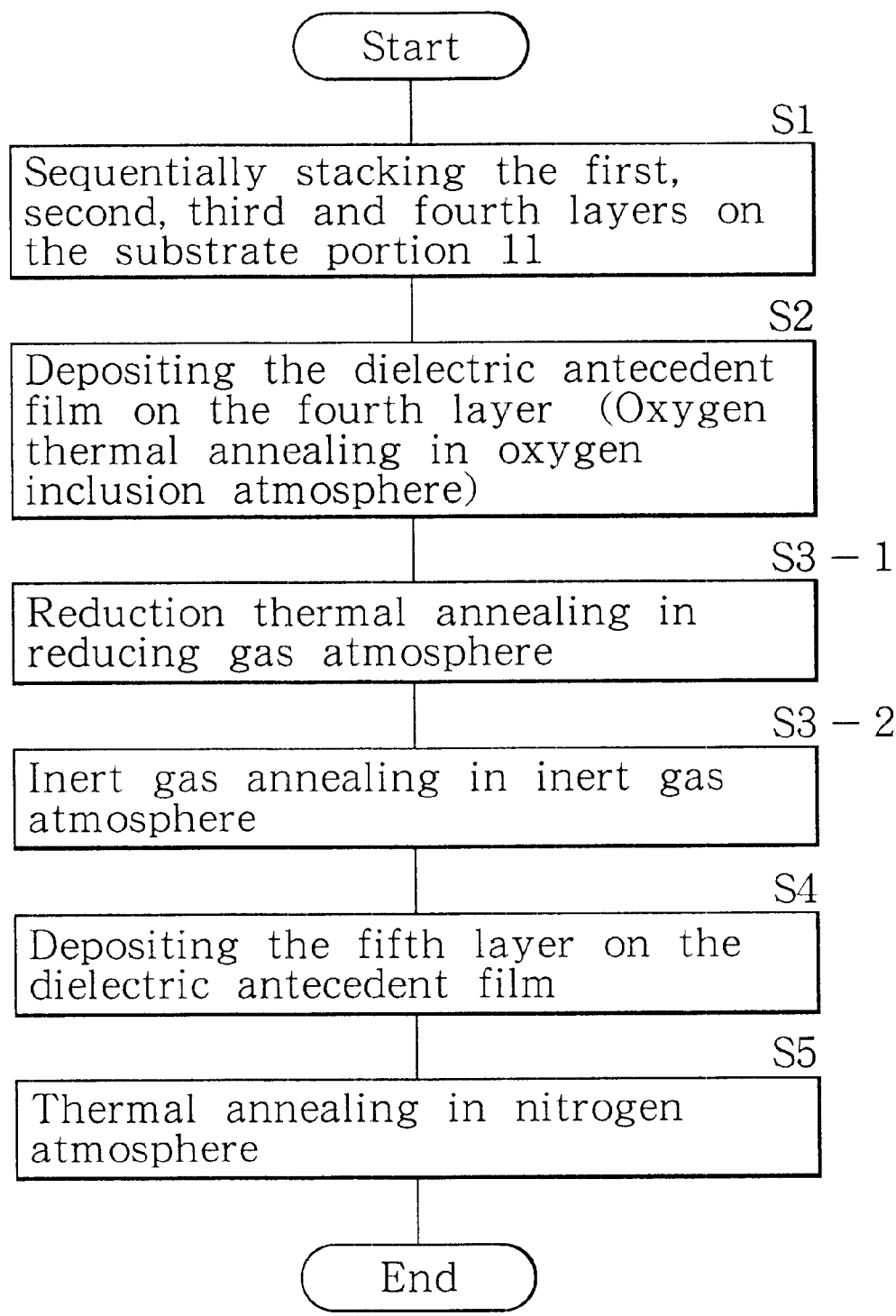
FIG. 3 is a flow chart showing steps of another manufacturing method of the dielectric capacitor shown in FIG. 1

The dielectric capacitor 10 is manufactured as follows:
FIG. 3 shows steps of another manufacturing process of the dielectric capacitor 10. Firstly, the first, second, third, and fourth layers are sequentially stacked on the substrate portion 11 in the same manner as the manufacturing method described above, for example (Step S1).

Subsequently, as a step for manufacturing the dielectric film 13, the dielectric antecedent film is deposited on the fourth layer in the same manner as the manufacturing method described above (Step S2 ). A part of the first, second, third, and fourth layers is oxidized by the oxygen thermal annealing in Step 2. Next, as the step for forming the dielectric film 13, reduction thermal annealing is performed thereon in a reducing gas atmosphere including hydrogen gas ($H_2$), carbon monoxide gas (CO) or methane gas ($CH_4$), for example (Step S3-1). As a result, oxide generated in a part of the first, second, third, and fourth layers is reduced in the oxygen thermal annealing in Step S2. Therefore, deterioration in characteristics of the dielectric film 13 is prevented even if hydrogen annealing takes place after this step.

After the reduction thermal annealing, as the step for forming the dielectric film 13, crystals of the dielectric antecedent film are grown through thermal annealing, for example (Step S3-2). At this time, the thermal annealing is performed in an inert gas atmosphere, not in an oxygen inclusion atmosphere, for preventing re-reduction of part of the first, second, third, and fourth layers in this step. Unlike the manufacturing method described above, the temperature for inert gas thermal annealing need not be equal or higher than that in the oxygen thermal annealing in Step S2. This is because the oxide produced in part of the first, second, third, and fourth layers has been already reduced through the reduction thermal annealing in Step S3-1.

Here, the second layer is formed between the first layer and the third layer, using at least one selected from the precious metal element group. Therefore, even when the reduction thermal annealing and the inert gas thermal annealing take place, deterioration of the first layer is prevented, thereby securing adhesion.

After the inert gas thermal annealing, the fifth layer to comprise the top electrode 14 is deposited on the dielectric antecedent film in the same manner as the manufacturing method described above (Step S4) and then thermal annealing is performed thereon in a nitrogen atmosphere (Step S5). Thus, the dielectric capacitor 10 shown in FIG. 1 is formed.

Figure 4:
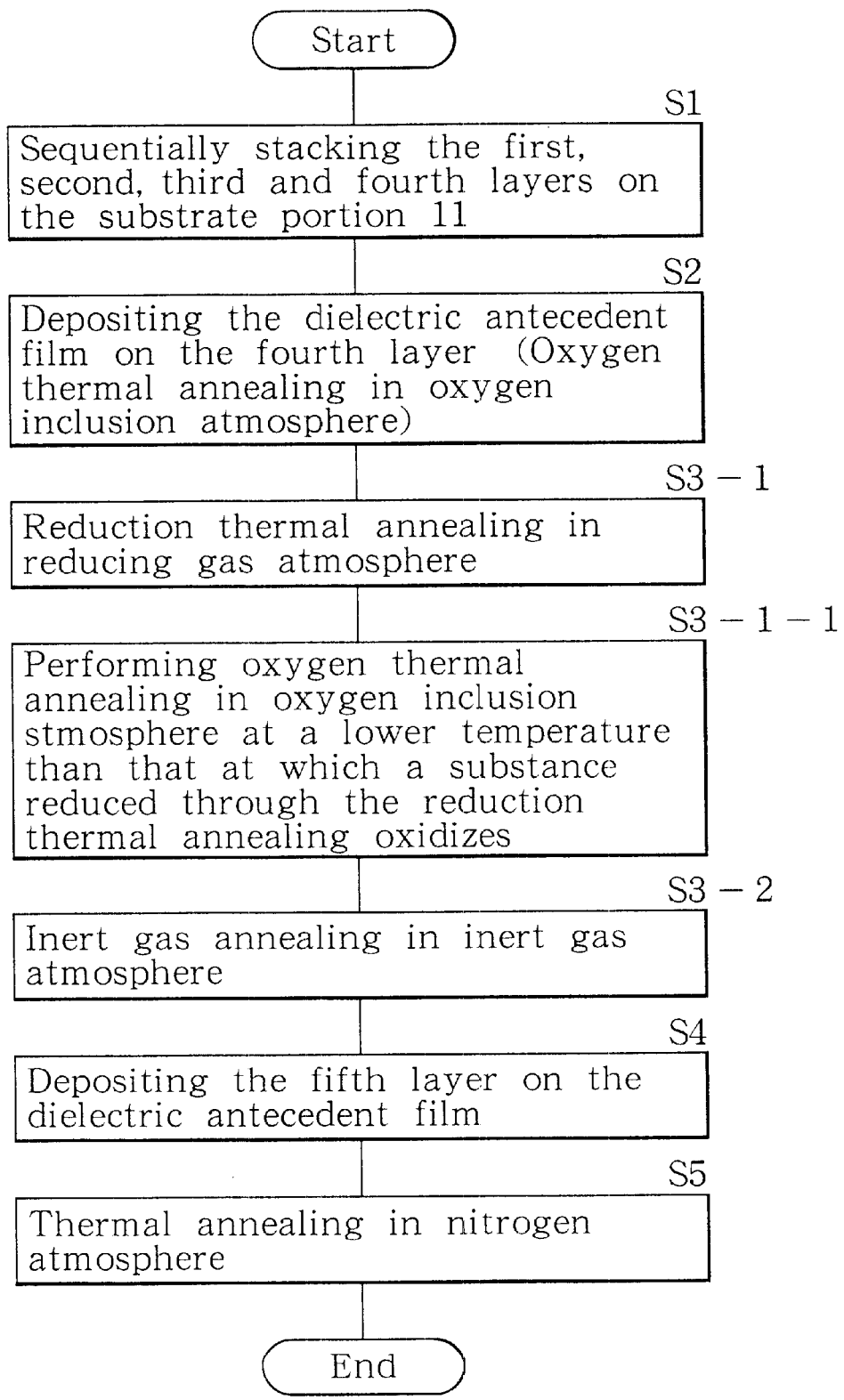
FIG. 4 is a flow chart showing steps of still another manufacturing method of the dielectric capacitor shown in FIG. 1.

When the dielectric capacitor 10 is manufactured in this manufacturing method, for example as shown in FIG. 4, after the reduction thermal annealing, prior to the inert gas thermal annealing, another oxygen thermal annealing may be performed in an oxygen inclusion atmosphere at a temperature lower than the temperature at which a substance which has been reduced in the reduction thermal annealing oxidizes, (Step S3-1-1). By this treatment, oxygen is added to the dielectric antecedent film, thereby improving the characteristics of the dielectric film 13. Specifically, when the substrate portion 11 is formed of several members made of different materials, the following occurs. The amount of oxide produced in part of the first, second, third, and fourth layers through the oxygen thermal annealing in RTA differs depending on the place based on the difference in thermal conductivity of the material. Therefore, when all of these oxides are attempted to be reduced by the reduction thermal annealing, lack of oxygen occurs in the dielectric antecedent film depending on the place. However, according to the method, oxygen is added to the dielectric antecedent film through the oxygen thermal annealing at a low temperature so that the characteristics of the dielectric film 13 can be improved.

The dielectric capacitor 10 operates as follows:

In the dielectric capacitor 10, when voltage is applied between the top electrode 14 and the bottom electrode 12, polarization occurs in the dielectric film 13. Since the characteristics of the dielectric film 13 has been improved by the inert gas thermal annealing or the reduction thermal annealing, the dielectric capacitor 10 displays excellent characteristics. Also, the precious metal layer 12b is provided between the adhesive layer 12C and the oxygen inclusion layer 12a. Therefore, even when the inert gas thermal annealing or reduction thermal annealing is performed in the manufacturing process, adhesion of the bottom electrode 12 can be secured.

As described above, according to the dielectric capacitor 10 of the embodiment, the precious metal layer 12b is provided between the adhesive layer 12c and the oxygen inclusion layer 12a so that adhesion of the bottom electrode 12 is secured even if the inert gas thermal annealing or reduction thermal annealing takes place in order to improve the characteristics of the dielectric film 13. That is, while adhesive of the bottom electrode 12 is secured, the characteristics of the dielectric film 13 can be improved.

According to the method of manufacturing the dielectric capacitor of the embodiment, the second layer is deposited using at least one selected from the precious metal element group between the first layer, which is to construct the adhesive layer 12c, and the third layer, which is to construct the oxygen inclusion layer 12a. Therefore, adhesion of the bottom electrode 12 is secured even when the inert gas thermal annealing or the reduction thermal annealing takes place in order to improve the characteristics of the dielectric film 13. Accordingly, at the time of forming the dielectric 13, the inert gas thermal annealing or the reduction thermal annealing is performed after the oxygen thermal annealing, which secures adhesion of the bottom electrode 12 and prevents deterioration in characteristics of the dielectric film 13, as well. As a result, the dielectric capacitor 10 with excellent characteristics can be easily manufactured.

Furthermore, when the reduction thermal annealing takes place in order to improve the characteristics of the dielectric film 13, the manufacture thereof can be performed at a low temperature. Thereby, stable characteristics can be obtained and productivity is improved as well. When the oxygen thermal annealing is performed after the reduction thermal annealing at a lower temperature than the temperature at which a substance, which has been reduced through the reduction thermal annealing, oxidizes, the characteristics of the dielectric film 13 can be further improved. Additionally, in the case where the substrate portion 11 is composed of several members made of different materials, similar effects can be obtained.

The dielectric capacitor 10 is used as a part of a memory as follows, for example.

Figure 5:
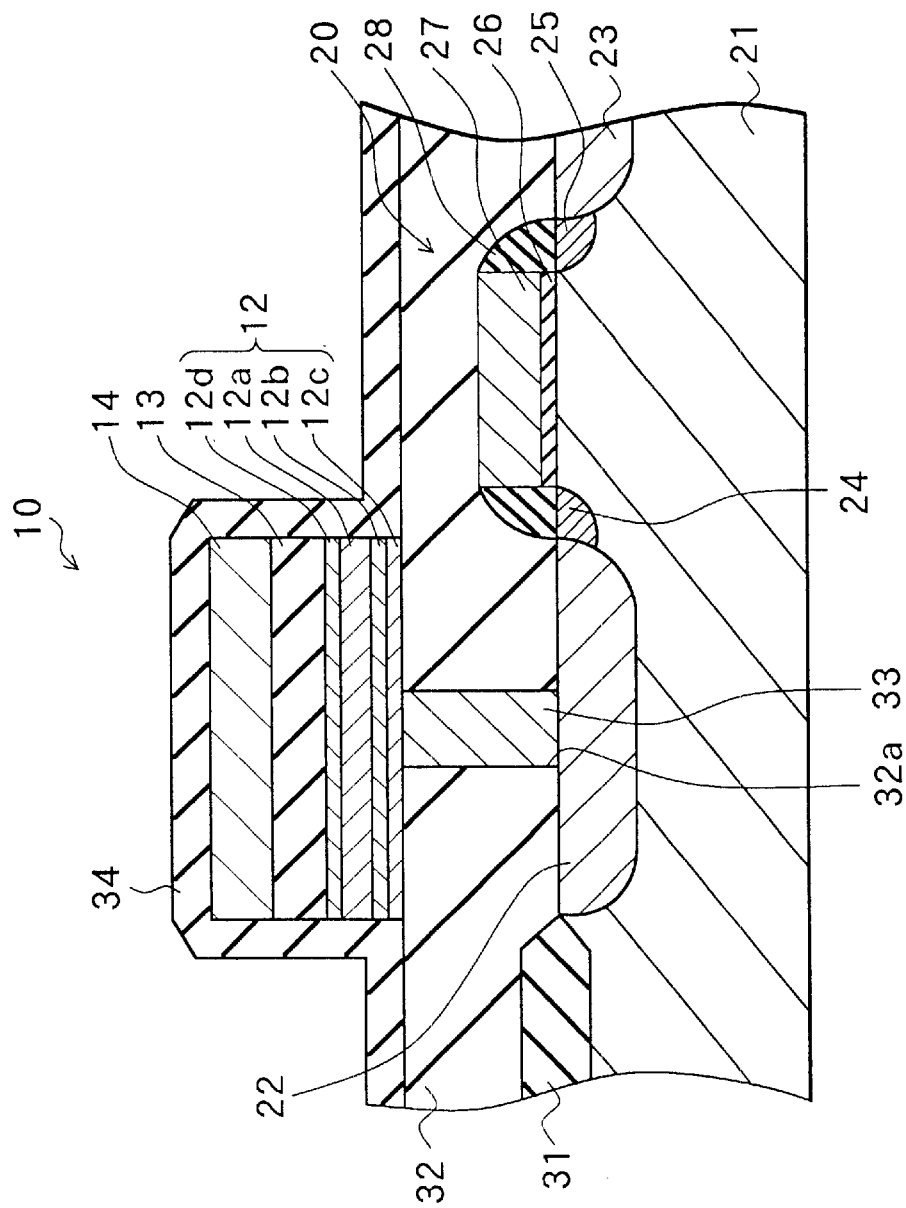
FIG. 5 is a cross section showing a construction of a memory in which the dielectric capacitor shown in FIG. 1 is employed.

FIG. 5 shows one example of the memory with the dielectric capacitor. The memory is composed of the dielectric capacitor 10 according to this embodiment and a transistor 20 for switching. The transistor 20 has, for example, a source region 22 made of an $n^+$ layer, and a drain region 23 made of an $n^+$ layer, which are formed with space therebetween on the surface of a substrate 21 made of p-type silicon. On the surface of the substrate 21 between the source region 22 and the drain region 23, LDD regions 24 and 25 made of an $n^+$ layer with space therebetween are formed adjacent to the source region 22 and the drain region 23, respectively. A gate electrode 27 is formed, as a word line, through a gate insulating film 26 on the surface of the substrate 21, between the source region 22 and the drain region 23. A gate side wall 28 made of an insulating material is formed on the side surface portion of the gate electrode 27. Around the transistor 20, a field film oxide 31 for separating devices is formed on the surface of the substrate 21.

The dielectric capacitor 10 is formed on the transistor 20 sandwiching a layer insulating film 32 in between. That is, the bottom electrode 12, the dielectric film 13 and the top electrode 14 are stacked sequentially through the layer insulating film 32. The source region 22 of the transistor 20 and the bottom electrode 12 of the dielectric capacitor 10 are electrically coupled through a contact hole 32a provided in the layer insulating film 32. A plug layer 33 made of polycrystalline silicon, tungsten, or the like is embedded in the contact hole 32a. That is, the substrate portion 11 is composed of the layer insulating film 32 and the plug layer 33. An insulating layer 34 is formed on the dielectric capacitor 10.

The memory may be manufactured as follows:

First of all, the transistor 20 is formed on the surface of the substrate 21 by an appropriate method, and, then, the layer insulating film 32 is formed thereon by the CVD (chemical vapor deposition) method or the like. Next, the contact hole 32a is formed by selectively etching the layer insulating film 32 to expose the source region 22 of the transistor 20. Then, the plug layer 33 is embedded in the contact hole 32, and the plug layer 33 is connected to the source region 22. After that, the dielectric capacitor 10 is formed on the plug layer 33 as described above, and the bottom electrode 12 is connected to the plug layer 33. After the dielectric capacitor 10 is formed, hydrogen annealing is performed thereon in a hydrogen inclusion atmosphere to recover the functionality of the transistor 20. As described above, when forming the dielectric film 13, the oxygen thermal annealing followed by the inert gas thermal annealing and the reduction thermal annealing is performed so that the characteristics of the dielectric film 13 do not deteriorate by the hydrogen annealing. After that, the insulating film 34 is formed on the surface by the CVD method or the like. Thereby, the memory shown in FIG. 5 is formed.

The memory operates as follows:

In this memory, applying voltage to the gate electrode 27 of the transistor 20 switches the transistor 20 to "ON", for example, and energizes between the source region 22 and the drain region 23. As a result, the dielectric capacitor 10 is energized through the plug layer 33, and voltage is applied between the top electrode 14 and the bottom electrode 12. Applying voltage to the dielectric capacitor 10 causes polarization in the dielectric film 13. By this polarization, "1" or "0" data is stored or read out. Here, the characteristics of the dielectric capacitor 10 have been already improved through the inert gas thermal annealing or the reduction thermal annealing so that the memory achieves high performance. Also, adhesion of the bottom electrode 12 is improved by the precious metal layer 12b and therefore reliability of the memory is improved.

As described above, the memory comprises the dielectric capacitor 10 according to the embodiment. Consequently, while adhesion of the bottom electrode 12 is secured, the characteristics of the dielectric film 13 can be improved, thereby improving performance and reliability of the memory.

The manufacturing method of the memory includes the steps of the manufacturing method of the dielectric capacitor 10 according to the embodiment. Therefore, even though the hydrogen annealing takes place in order to recover the functionality of the transistor 20 after forming the dielectric capacitor 10, deterioration in characteristics of the dielectric capacitor 10 can be prevented and adhesion of the bottom electrode 12 can be secured, as well. Thus, a memory with excellent performance can be easily manufactured.

Second Embodiment

This embodiment shows another example for a material comprising the adhesion layer 12c of the first embodiment. Therefore, the same reference numbers are given to the same components, and the detailed description for the same components is omitted, here.

The adhesive layer 12c mainly includes an alloy consisting of at least one selected from the precious metal element group shown in Table 1 and at least one selected from the transition metal element group shown in Table 1, for example. The following Chemical Formula 3 shows the composition formula of the alloy where an element in the precious metal element group is $M_{III}$ and an element in the transition metal element group is $M_{IV}$. Its composition range is preferably $97 \geq d \geq 90$, $10 \geq e \geq 3$, d+e=100 in atom %. If the precious metal element $M_{III}$ exceeds this range, sufficient adhesion cannot be obtained. More transition metal element $M_{IV}$ causes deterioration of the surface characteristics and lowers adhesion due to selective oxidation of the transition metal element $M_{VI}$.

$$M_{IIId}M_{IVe} \qquad \text{Chemical Formula 3}$$

$M_{III}$: an element in the precious metal element group $M_{IV}$: an element in the transition metal element group A more preferable composition range of the alloy is $95 \geq d \geq 91$, $9 \geq e \geq 5$, d+e=100 in atom %. Within this range, better surface characteristics and adhesion can be obtained. Incidentally, this alloy is crystalline.

This alloy may include the precious metal element $M_{III}$, which is different from that of the oxygen inclusion layer 12a or the precious metal layer 12b and 12d, and also may include the transition metal element $M_{IV}$, which is different from that of the oxygen inclusion layer 12a. Preferably, however, the alloy is composed so as to include the same element as that in the oxygen inclusion layer 12a or the precious metal layer 12b and 12d in view of productivity.

The dielectric capacitor 10 can be manufactured in the same manner as the first embodiment except that the first layer, which is to comprise the adhesive layer 12c, is deposited using the alloy $M_{IIId}M_{IVe}$. The dielectric capacitor 10 is used for the memory similar to the first embodiment.

In addition to the effects explained in the first embodiment, according to this embodiment, since the adhesive layer 12c includes the alloy $M_{IIId}M_{IVe}$, adhesion of the bottom electrode 12 is secured, thereby improving productivity.

EXAMPLES

Further, specific examples according to the present invention will be described in detail with reference to FIGS. 1 through 5.

Example 1

Firstly, a silicon substrate was used for the substrate portion 11 and a first layer of 20 nm in thickness made of titanium, a second layer of 20 nm in thickness made of iridium, a third layer of 100 nm thickness made of $Ir_aHf_bO_c$ and a fourth layer of 20 nm in thickness made of iridium were sequentially stacked and deposited by sputtering method (see Step S101, FIG. 2.)

Next, a sol-gel solution containing strontium, bismuth and tantalum in the mole ratio of Sr:Bi:Ta=0.8:2.2:2.0 was prepared, and the sol-gel solution was applied on the fourth layer by the spin coat method. Then, thermal annealing took place at a temperature of 250° C. in the atmosphere for seven minutes to remove an organic solvent component, and RTA was performed under the following condition.
[RTA Condition]
Atmosphere gas: mixed gas of nitrogen gas and oxygen gas; nitrogen gas-oxygen gas ratio (volume ratio): $N_2:O_2=4:1$
Speed of temperature increase: 760° C./10 sec.
Maximum temperature achieved: 760° C.
Maximum temperature retaining time: 30 sec.

By the RTA, a layer structure oxide (referred to as SBT hereinafter) including strontium, bismuth and tantalum was obtained. The SBT was microlite. Then, the process from applying the so-gel solution to RTA was replicated three times, and a dielectric antecedent film of 170 nm in thickness mainly including SBT was deposited (see Step S2, FIG. 2).

Then, inert gas thermal annealing was performed at a temperature of 800° C. in a nitrogen atmosphere for one hour (see Step S3, FIG. 2). After that, a fifth layer of 200 nm in thickness was deposited on the dielectric antecedent film using platinum by the sputtering method (see Step S4, FIG. 2), and the thermal annealing was performed at a temperature of 650° C. in a nitrogen atmosphere for 10 minutes (see Step S5, FIG. 2). Thereby, the dielectric capacitor 10 was obtained.

Ferroelectric characteristics of the manufactured dielectric capacitor 10 were determined. The manufacturing condition and the measurement results for the dielectric capacitor 10 are shown in Table 2 and 3. Table 2 and 3 provide 20 $\mu C/cm^2$ for the dielectric polarization value 2 Pr and 1.8 V for the coercive voltage 2 Vc, which were favorable values as a dielectric capacitor including SBT.

TABLE 2

| | Manufacturing Condition | | | | |
|---|---|---|---|---|---|
| | Precious metal layer 12b (Yes/No) | Annealing in formation of dielectric film 13 | Composition of dielectric film 13 | Composition of adhesive layer 12c | Composition of substrate portion 11 |
| EX.1 | Yes | 800° C. $N_2$ atmosphere | SBT | Ti | Si base |
| EX.2 | Yes | 1. 400° C. reduction atmosphere 2. 750° C. $N_2$ atmosphere | SBT | Ti | $SiO_2$ film (30 nm thick) |
| EX.3 | Yes | 1. 400° C. reduction atmosphere 2. 750° C. $N_2$ atmosphere | SBTN | Ti | Si base $SiO_2$ film (300 nm thick) |
| EX.4 | Yes | 1. 400° C. reduction atmosphere 2. 400° C. $O_2$ atmosphere 3. 750° C. $N_2$ atmosphere | SBTN | Ti | Si base $SiO_2$ film (300 nm thick) |
| EX.5 | Yes | 750° C. $N_2$ atmosphere | SBT | IrHf | $SiO_2$ film (30 nm thick) |
| Comparative EX.1 | No | 800° C. $N_2$ atmosphere | SBT | Ti | Si base |
| Comparative EX.2 | Yes | 800° C. $O_2$ atmosphere | SBT | Ti | Si base |
| Comparative EX.3 | Yes | 750° C. $N_2$ atmosphere | SBT | Ti | $SiO_2$ film (30 nm thick) |

TABLE 3

| | Characteristics | | | | |
|---|---|---|---|---|---|
| | Before hydrogen annealing | | After hydrogen annealing | | |
| | Dielectric Polarization 2Pr ($\mu C/cm^2$) | Resistance 2Vc (V) | Dielectric Polarization 2Pr ($\mu C/cm^2$) | Resistance 2Vc (V) | Peeling Yes/No |
| EX.1 | 20 | 1.8 | 20 | 1.8 | No |
| EX.2 | 19 | 1.8 | 19 | 1.8 | No |
| EX.3 | 18 | 2.0 | 18 | 1.8 | No |
| | 18 | 2.0 | 14 | 2.2 | No |
| EX.4 | 18 | 2.0 | 18 | 2.0 | No |
| | 18 | 2.0 | 18 | 2.0 | No |
| EX.5 | 19 | 1.8 | 19 | 1.8 | No |
| Comparative EX.1 | 20 | 1.8 | 20 | 1.8 | Yes |
| Comparative Ex.2 | 20 | 1.8 | N/A | N/A | No |

TABLE 3-continued

| | Characteristics | | | | |
| --- | --- | --- | --- | --- | --- |
| | Before hydrogen annealing | | After hydrogen annealing | | |
| | Dielectric Polarization 2Pr ($\mu C/cm^2$) | Resistance 2Vc (V) | Dielectric Polarization 2Pr ($\mu C/cm^2$) | Resistance Volt. 2Vc (V) | Peeling Yes/No |
| Comparative Ex.3 | 19 | 1.8 | N/A | N/A | No |

Further, hydrogen annealing was performed and then the recovery thermal annealing was performed on the dielectric capacitors 10 at a temperature of 450° C. in a nitrogen atmosphere for 30 minutes under the following condition.
[Hydrogen Annealing Condition]
Atmosphere gas: mixed gas of nitrogen gas and oxygen gas, nitrogen
gas-oxygen gas ratio (volume ratio) $N_2:O_2=96:4$
Annealing temperature: 400° C.
Annealing time: 1 hr.

After that, measurement of the ferroelectric characteristics after the hydrogen annealing was performed and a so-called tape test, i.e., sticking and then unsticking an adhesive tape was performed on the dielectric capacitor 10. The results are shown in the Table 2 and 3. The ferrolectric characteristics are 20 $\mu C/cm^2$ for the dielectric polarization value 2 Pr and 1.8 V for the coercive voltage 2 Vc, which were the same values as before the hydrogen annealing was performed. It reveals that application of forming gas annealing does not deteriorate the characteristics of the dielectric capacitor 10. Nothing came off in the tape test.

As a comparative example (Comparative Example 1) to the First example, a dielectric capacitor was manufactured under the same condition as the First example except that the second layer, which was to construct the precious metal layer 12b, was not formed. Measurement of the ferroelectric characteristics and the tape test were performed on this dielectric capacitor similar to the first example. The results and manufacturing conditions are shown in Table 2 and 3. The same results were obtained as in the First example with regard to the ferroelectric characteristics but peeling was observed in the bottom electrode in the tape test.

As another comparative example (Comparative Example 2) to the first example, a dielectric capacitor was manufactured under the same condition as in the first example except that after depositing the dielectric antecedent film, oxygen thermal annealing was performed in an oxygen inclusion atmosphere at a temperature of 800° C. for one hour in addition to the inert gas thermal annealing. Measurement of the ferroelectric characteristics and the tape test were performed on the dielectric capacitor similar to the first example. The results and the manufacturing conditions are shown in Table 2 and 3. The ferroelectric characteristics before the hydrogen annealing were the same as those obtained in the first example. However, after the hydrogen annealing was performed, the dielectric capacitor was completely shorted out so that measurement was impossible. With regard to the tape test, no peeling was found.

As a result, the following is found. When forming the dielectric film 13, by performing the oxygen thermal annealing followed by the inert gas thermal annealing at a temperature equal to or higher than the temperature in the oxygen thermal annealing, it becomes possible to prevent deterioration of characteristics caused by the hydrogen annealing. Moreover, forming the second layer, which is to comprise the precious metal layer 12b, secures adhesion of the bottom electrode 12 without deteriorating the characteristics.

Example 2

Firstly, a dioxide silicon film of 30 nm thick formed on a silicon substrate was used for the substrate portion 11 and the first, second, third, and fourth layers were deposited and stacked sequentially thereon similar to the First example (See Step S1, FIG. 3). Subsequently, similar to the first example, a dielectric antecedent film was deposited. (See Step S2, FIG. 3). When an identification analysis was performed on the dielectric antecedent film by X-ray diffraction, existence of iridium oxide ($IrO_2$) was recognized. That is, a part of the second, third and fourth layers was oxidized through the oxygen thermal annealing.

Next, the oxygen thermal annealing was performed under the following conditions (See Step S3-1, FIG. 3). Here again, when the identification analysis was performed by X-ray diffraction, no existence of iridium oxide was found. That is, oxide, which had been produced in a part of the second, third, and fourth layers by the oxygen thermal annealing, was reduced through the reduction thermal annealing.
[Reduction Thermal Annealing Condition]
Atmosphere gas: mixed gas of nitrogen gas and oxygen gas; nitrogen
gas-oxygen gas ratio (volume ratio) $N_2:O_2=96:4$
Annealing temperature: 400° C.
Annealing time: 1 hr.

After the reduction thermal annealing was performed, inert gas thermal annealing was performed at a temperature of 750° C. in a nitrogen atmosphere for one hour, respectively (See Step S3-2, FIG. 3). After the inert gas thermal annealing, a fifth layer was deposited similar to the first example (See Step S4, FIG. 3). Then, thermal annealing was performed in a nitrogen atmosphere in the same manner as the first example (See Step S5, FIG. 3). Thereby, the dielectric capacitor 10 was obtained.

Measurement of ferroelectric characteristics and the tape test were performed on this dielectric capacitor 10 in the same manner as the first example. The manufacturing conditions and the results are shown in Table 2 and 3. In regard to the ferroelectric characteristics, favorable values, 19 $\mu C/cm^2$ for the dielectric polarization value 2 Pr and 1.8 V for the coercive voltage 2 Vc, were obtained before and after the hydrogen annealing and no deterioration caused by the hydrogen annealing was detected. In the tape test, no peeling was found.

As a comparative example (Comparative Example 3) to the second example, a dielectric antecedent film was deposited and then a dielectric capacitor was manufactured under the same conditions as the second example except that the reduction thermal annealing was not performed. Measurement of the ferroelectric characteristics and the tape test were performed on this dielectric capacitor similar to the first example. The results and manufacturing conditions are shown in Table 2 and 3. In regard to the ferroelectric characteristics, the same results were obtained as in the second example before the hydrogen annealing was performed. However, after the hydrogen annealing, the dielectric capacitor was completely shorted out, and therefore measurement was impossible. In the tape test, no peeling was recognized.

As a result, the following is found. When forming the dielectric film 13, by performing the oxygen thermal annealing followed by the reduction thermal annealing, it becomes possible to prevent deterioration of characteristics caused by the hydrogen annealing. Moreover, formation of the second layer, which is to comprise the precious metal layer 12b, can secure adhesion of the bottom electrode 12 without deteriorating the characteristics thereof.

Example 3

First of all, two kinds of the substrate portion 11, one comprising a silicon base and the other comprising a silicon dioxide film of 300 nm in thickness formed on the silicon base were prepared. Then, similar to the first example, on each of the substrate portions 11, a first, second, third and fourth layers were sequentially deposited and stacked (see Step S1, FIG. 3).

Next, a sol-gel solution containing strontium, bismuth, tantalum and niobium in the mole ratio of Sr:Bi:Ta:Nb= 0.8:2.2:1.75:0.25 was prepared, and a dielectric antecedent film of 170 nm in thickness mainly including layer structure oxide (referred to as SBTN herein below) containing strontium, bismuth, tantalum and niobium was deposited in the same manner as the first example, respectively (see Step S2, FIG. 3). RTA was performed under the following condition.

[RTA Condition]

Atmosphere gas: mixed gas of nitrogen gas and oxygen gas; nitrogen gas-oxygen gas ratio (volume ratio): $N_2:O_2=4:1$ Speed of temperature increase: 740° C./10 sec.

Maximum temperature achieved: 740° C.

Maximum temperature retaining time: 30 sec.

Subsequently, reduction thermal annealing was performed on both dielectric antecedent films, respectively under the following condition (See Step S3-1, FIG. 3).

[Reduction Thermal Annealing Condition]

Atmosphere gas: mixed gas of nitrogen gas and hydrogen gas; nitrogen gas-hydrogen gas ratio (volume ratio) $N_2:H_2=96:4$ Annealing temperature: 400° C.

Annealing time: 1 hr.

After the reduction thermal annealing was performed, inert gas thermal annealing was performed on both dielectric antecedent films at a temperature of 750° C. in a nitrogen atmosphere for one hour, respectively (see Step S3-2, FIG. 3). After that, similar to the first embodiment, a fifth layer was deposited on both dielectric antecedent films, respectively (See Step 4, FIG. 3), and thermal annealing was performed in a nitrogen atmosphere thereon, respectively (See Step S5, FIG. 3). Thus, the dielectric capacitors 10 were respectively obtained.

With regard to the dielectric capacitors 10, measurement of the ferroelectric characteristics and the tape test were performed in the same manner as in the first example, respectively. The manufacturing conditions and the results are shown in Table 2 and 3. The ferroelectric characteristics of the dielectric capacitor 10 with the substrate portion 11 comprising the silicon base was 18 $\mu C/cm^2$ for the dielectric polarization value 2 Pr and 2.0 V for the coercive voltage 2 Vc before the forming gas annealing, and 18 $\mu C/cm^2$ for the dielectric polarization value 2 Pr and 1.8 V for the coercive voltage 2 Vc after the forming gas annealing. These values were favorable and no deterioration caused by the hydrogen annealing was detected. The ferroelectric characteristics of the dielectric capacitor 10 with the substrate portion 11 comprising the dioxide silicon film were 18 $\mu C/cm^2$ for the dielectric polarization value 2 Pr and 2.0 V for the coercive voltage 2 Vc before the forming gas annealing, and 14 $\mu C/cm^2$ for the dielectric polarization value 2 Pr and 2.2 V for the coercive voltage 2 Vc after the forming gas annealing. Although deterioration caused by the hydrogen annealing was observed, the degree of deterioration was sufficiently improved. In the tape test, no peeling was found in both dielectric capacitors 10.

As a result, it was found that in both cases where the substrate portion 11 is made of silicon and the case where the substrate portion 11 is made of dioxide silicon, by performing reduction thermal annealing under the same condition, deterioration of characteristics caused by hydrogen annealing can be prevented. Also, it was found that by forming the second layer comprising the precious metal layer 12b, adhesion of the bottom electrode 12 can be secured without deteriorating the characteristics. More specifically, it was found that as shown in FIG. 5 when both of the layer insulating film 32 made of dioxide silicon and the plug layer 33 made of silicon serve as the substrate portion 11, adhesion is secured as well as deterioration of the characteristics can be prevented.

The characteristics of the substrate portion 11 comprising the silicon base and the substrate portion 11 comprising the dioxide silicon film are different. This is considered to occur due to the following reason. Thermal conductivity of the dioxide silicon film is lower than that of the silicon base so that in the case where the dioxide silicon film is used for the substrate portion 11, the actual temperature in the second, third, and fourth layers at the time of RTA becomes higher than the temperature in the case where a silicon base is used, which causes more dioxide to be produced.

Fourth Example

After the reduction thermal annealing was performed, the dielectric capacitors 10 were manufactured under the same conditions as the third example except that prior to the inert gas thermal annealing, the oxygen thermal annealing was performed at a temperature of 400° C. in an oxygen gas atmosphere for one hour (See Step S3-1-1, FIG. 4). Similar to the third example, two kinds of substrate portions 11, one comprising a silicon base and the other comprising a dioxide silicon film of 300 nm in thickness formed on a silicon base were prepared and the dielectric capacitors 10 were manufactured on the silicon base and dioxide silicon film, respectively. Similar to the first example, measurement of the ferroelectric characteristics and the tape test were performed on these dielectric capacitors 11. The measurement conditions and the results are shown in Table 2 and 3.

In both cases where the silicon base was used for the substrate portion 11 and the case where the dioxide silicon film was used for the substrate portion 11, with regard to the ferroelectric characteristics, favorable values, 18 $\mu C/cm^2$ for the dielectric polarization value 2 Pr and 2.0 V for the coercive voltage 2 Vc, were obtained before and after the hydrogen annealing and deterioration caused by the hydrogen annealing was not observed. In the tape test, no peeling was detected in both dielectric capacitors 10.

As a result, it was found that in both cases where the substrate portion 11 is made of silicon and the case where the substrate portion 11 is made of dioxide silicon, by performing the oxygen thermal annealing at a temperature at which oxidization does not occur in the second, third and fourth layers after the reduction thermal annealing prior to the inert gas thermal annealing, deterioration of characteristics caused by hydrogen annealing can be prevented. Also, it was found that by forming the second layer comprising the precious metal layer 12b, adhesion of the bottom electrode 12 can be secured without deteriorating the characteristics.

More specifically, it was found that as shown in FIG. 5 when both the layer insulating film 32 made of dioxide silicon and the plug layer 33 made of silicon serve as the substrate portion 11, adhesion is secured and better characteristics than those obtained in the third example can be obtained.

Example 5

Firstly, a dioxide silicon film of 30 nm in thickness formed on a silicon base was used for the substrate portion 11 and, similar to the first example, a first, second, third, and fourth layers were deposited and stacked sequentially thereon (See Step S1, FIG. 3). Unlike the aforementioned examples in this example, the first layer was deposited using $Ir_{92}Hf_8$ in atom % with the same sputter target as a target for depositing the third layer.

Subsequently, similar to the first example, a dielectric antecedent film was deposited (See Step S2, FIG. S3). When the identification analysis was performed on the dielectric antecedent film by X-ray diffraction, existence of iridium oxide ($IrO_2$) was recognized. That is, a part of the first, second, third and fourth layers was oxidized through the oxygen thermal annealing.

Next, the reduction thermal annealing was performed under the following conditions (See Step S3-1, FIG. 3). When the identification analysis was performed again on the dielectric antecedent film by X-ray diffraction, no existence of iridium oxide ($IrO_2$) was recognized. That is, oxide which was produced in a part of the first, second, third and fourth layers through the oxygen thermal annealing was reduced by the reduction thermal annealing.

[Reduction Thermal Annealing Condition]
Atmosphere gas: mixed gas of nitrogen gas and oxygen gas; nitrogen
gas-oxygen gas ratio (volume ratio): $N_2:H_2=96:4$
Annealing temperature: 400° C.
Annealing time: 1 hr.

After the reduction thermal annealing was performed, inert gas thermal annealing was performed at a temperature of 750° C. in a nitrogen atmosphere for one hour (See Step S3-2, FIG 3). After the inert gas thermal annealing, a fifth layer was deposited similar to the first example (See Step S4, FIG. 3). Then, thermal annealing was performed in a nitrogen atmosphere (See Step S5, FIG. 3). Thereby, the dielectric capacitor 10 was obtained.

Measurement of ferroelectric characteristics and the tape test were performed on this dielectric capacitor 10 in the same manner as the first example. The manufacturing conditions and the results are shown in Table 2 and 3. With regard to the ferroelectric characteristics, favorable values, 19 $\mu C/cm^2$ for the dielectric polarization value 2 Pr and 1.8 V for the coercive voltage 2 Vc, were obtained before and after the hydrogen annealing and no deterioration caused by the hydrogen annealing was detected. In the tape test, no peeling was found.

As a result, it was found that when the first layer, which is to comprise the adhesive layer 12c, is deposited using IrHf, strong adhesion and excellent characteristics can be obtained. More specifically, it was found that the favorable dielectric capacitor 10 can be easily obtained with less sputter targets.

Although the invention has been explained with the specific examples described above, the dielectric capacitor 10 of the invention can gain results similar to the aforementioned examples. For example, when the second layer, which is to comprise the precious metal layer 12b, is deposited using at least one selected from the precious metal element group shown in Table 1, adhesion is secured and the characteristics can be improved. Moreover, when the first layer, which is to comprise the adhesive layer 12c, is deposited using the above-described $M_{IIId}M_{Ive}$, strong adhesion and excellent characteristics can be obtained, thereby improving productivity.

Although the present invention has been described with the embodiments and examples, the present invention is not limited to these embodiments and examples and various modifications are possible. For example, in the above-described embodiments and examples, explained is a case where the bottom electrode 12 includes the precious metal layer 12d between the oxygen inclusion layer 12a and dielectric film 13. However, the present invention is applied to the case where the precious metal layer 12d is not provided.

Although, in the aforementioned embodiments and examples, explained is a case where the oxygen inclusion layer 12a includes $M_{Ia}M_{IIb}O_c$ made of at least one selected form the precious metal layer, at least one selected from the transition metal element group and oxygen, the present invention is applied to the case where the oxygen inclusion layer 12a is composed of a different material including oxygen.

Furthermore, in the above-described embodiments and examples, explained is a case where the bottom electrode 12 comprises the adhesive layer 12c, which is composed of the alloy $M_{IIId}M_{Ive}$ consisting of at least one selected from the precious metal group and at least one selected from the transition metal element group, the precious metal element layer 12b, the oxygen inclusion layer 12a and precious metal layer 12d. However, the adhesive layer 12c including the alloy $M_{IIId}M_{Ive}$ is used for the bottom electrode having a different construction. For example, when at least either the precious metal layer 12b or 12d is not provided or when no oxygen inclusion layer 12a is provided, the adhesive layer 12c is used. Further, not only the case where the adhesive layer 12c is provided adjacent to the substrate portion 11, but also the case where the adhesive layer 12c is provided in another location or the adhesive layer 12c is provided in a top electrode, is possible.

Additionally, in the embodiments and examples above, while described is a case where the dielectric film 13 is composed of the ferroelectric including the layer structure oxide containing bismuth, the present invention may be applied to the case where the dielectric film is composed of other ferroelectric including PZT or the like, and the same effect can be obtained.

Still further, the present invention may be applied to the case where the dielectric film is composed of a high dielectric also, and the same effects can be obtained. Such a high dielectric includes oxide made of oxygen and two or more elements selected from a group consisting of, for example, magnesium (Mg), calcium, strontium, and barium as the IIa family element, titanium and zirconium as the IVa family element, niobium and tantalum as the Va family element, lead (Pb) and tin (Sn) as the IVb family element, and bismuth as the Vb family element. In particular, the oxide is preferably composed of a first element A, which is at least one selected from a group consisting of magnesium, calcium, strontium and barium in the IIa family element and lead of the IVb family element, a second element B, which is at least one selected from a group consisting of titanium and zirconium in the IVa family element and tin in the IVb family element, and oxygen. Its composition formula is preferably expressed by $ABO_3$ so that excellent characteristics can be obtained.

Further, in the embodiments and examples above, while the dielectric film is formed by the so-gel method, the dielectric film may be formed by other methods such as the MOCVD (metal organic chemical vapor deposition) method, the laser abrasion method, the MOD (metal organic decomposition) method or the sputtering method.

In addition, in the embodiments and examples above, in forming the dielectric film 13, when the oxygen thermal annealing is performed and, then the inert gas thermal annealing is performed at a temperature equal to or higher than that in the oxygen thermal annealing in order to improve characteristics of the dielectric film 13, crystals of the dielectric antecedent film are also grown through the inert gas thermal annealing. However, the inert gas thermal annealing does not need to be the thermal annealing for crystal growth. Further, when the oxygen thermal annealing is performed and, then, the reduction thermal annealing is performed in order to improve characteristics of the dielectric film 13, the reduction thermal annealing is performed before crystal growth in the dielectric antecedent film in the embodiments and examples. However, reduction thermal annealing may be performed after the crystals have been grown.

Still further, in the embodiments described above, described is the memory in which the dielectric capacitor 10 and the transistor 20 are formed perpendicular to the base 21. However, the present invention may be applied to a memory in which the dielectric capacitor 10 and the transistor 20 are formed in line in a direction parallel to the base 21.

Furthermore, in the embodiments described above, while the case where the dielectric capacitors 10 is used for one memory, the present invention may also be applied to an LSI (large-scale integrated circuit) memory in which a plurality of memories are integrated.

As described herein before, according to the dielectric capacitor of the present invention, the precious metal layer including at least one selected from the precious metal element group between the oxygen inclusion layer and the adhesive layer is provided. Therefore, even though inert gas thermal annealing or reduction thermal annealing is performed in order to improve the characteristics of the dielectric film, adhesion of the first electrode can be secured. That is, an effect such that while adhesion of the first electrode is secured, the characteristics of the dielectric film are improved is obtained.

Specifically, according to the dielectric capacitor of the present invention, when the adhesive layer includes the alloy $M_{IIId}M_{Ive}$ made of at least one selected from the precious metal element group and at least one selected from the transition element group, the adhesive layer can have commonality of elements with the oxygen inclusion layer including $M_{Ia}M_{IIb}O_c$ made of at least one selected from the precious metal element group, at least one selected from the transition metal element group and oxygen, thereby improving productivity.

According to the dielectric capacitor of the present invention, when a layer including the alloy $M_{IIId}M_{Ive}$ made of at least one selected from the precious metal element group and at least one selected from the transition metal element group is provided, an electrode can be adhesive to the dielectric layer.

Further, according to the present invention, when the memory includes the dielectric capacitor of the invention adhesion of the first electrode is secured and the characteristics of the dielectric film can be improved, thereby improving reliability of performance of the memory.

Furthermore, according to the present invention, when the memory comprises the dielectric capacitor of the invention, the electrode can be adhesive to the dielectric layer. Thus, the memory with high reliability can be obtained.

According to the method of manufacturing the dielectric capacitor of the invention, as a step for forming the first electrode, the second layer is deposited between the first layer, which is to comprise the adhesive layer, and the third layer including oxygen, using at least one selected from the precious metal element group. Accordingly, even though inert gas thermal annealing or reduction thermal annealing takes place in order to improve the characteristics of the dielectric film, adhesion of the first electrode can be secured.

According to the method of manufacturing the dielectric capacitor of the invention when the inert gas thermal annealing takes place, as a step for forming the dielectric film, at a temperature equal to or higher than that in the oxygen thermal annealing is performed after the oxygen thermal annealing, adhesion of the first electrode is secured and deterioration in the characteristics of the dielectric film can be prevented. Consequently, the dielectric capacitor with excellent characteristics can be easily manufactured.

According to the method of manufacturing the dielectric capacitor of the invention, when the oxygen thermal annealing is performed and then oxide which is generated in a part of the first, second, third layers in the oxygen thermal annealing is reduced as a step for forming the dielectric film, adhesion of the first electrode is secured and deterioration in characteristics of the dielectric film can be prevented by performing the thermal annealing. Therefore, the dielectric capacitor with excellent characteristics can be easily manufactured at a low temperature. As a result, improvement in productivity can be achieved and stable characteristics can be obtained.

Furthermore, according to the method of manufacturing the dielectric capacitor of the invention, when reduction thermal annealing is performed and then oxygen thermal annealing is performed at a lower temperature than the temperature at which a substance, which has been reduced through the reduction thermal annealing, oxidizes, the characteristics of the dielectric film can be further improved. Specifically, when the dielectric capacitor is formed on the substrate portion which is composed of several members made of different materials, the same effect can be obtained.

The method of manufacturing the memory according to the invention includes steps of the manufacturing method of the dielectric capacitor of the invention. Therefore, even though hydrogen annealing is performed in order to recover functionality of the transistor after forming the dielectric capacitor, deterioration in characteristics of the dielectric capacitor can be prevented and adhesion of the first electrode can be secured. That is, the memory with excellent performance can be easily manufactured.

Obviously many modifications and variations of the present invention are possible in the light of the above teachings. It is therefore to be understood that within the scope of the appended claims the invention may be practiced otherwise than as specifically described.

What is claimed is:

1. A dielectric capacitor which is supported by a substrate portion and in which each of a first electrode and a second electrode is connected to a dielectric film, the first electrode comprising:

an oxygen inclusion layer including oxygen, which is provided between the substrate portion and- the dielectric film, a precious metal layer including at least one selected from a precious metal element group consisting of platinum (Pt), iridium (Ir), ruthenium (Ru), rhodium (Rh) and palladium (Pd), which is provided between the oxygen inclusion layer and the substrate portion, and an adhesive layer provided between the precious metal layer and the substrate portion.

2. A dielectric capacitor according to claim 1, wherein the oxygen inclusion layer includes an oxygen inclusion material made of at least one selected from the precious metal element group, at least one selected from a transition metal element group consisting of hafnium (Hf), tantalum (Ta), zirconium (Zr), niobium (Nb), vanadium (V), molybdenum (Mo), tungsten (W) and a rare-earth element, and oxygen (O), and the composition formula of the oxygen inclusion material is expressed by $M_{Ia}M_{IIb}O_c$, where an element in the precious metal element group is $M_I$ and an element in the transition metal element group is $M_{II}$, and its composition range is $90 \geq a \geq 4$, $15 \geq b \geq 2$, $c \geq 4$, $a+b+c=100$ in atom %.

3. A dielectric capacitor according claim 2, wherein the adhesive layer includes an alloy made of at least one selected from the precious metal element group and at least one selected from the transition metal element group, and the composition formula of the alloy is expressed by $M_{IIId}M_{IVe}$, where an element in the precious metal element group is $M_{III}$ and an element in the transition metal element group is $M_{IV}$ and its composition range is $97 \geq d \geq 90$, $10 \geq e \geq 3$, $d+e=100$ in atom %.

4. A dielectric capacitor according to claim 3, wherein the composition range of the composition formula $M_{IIId}M_{IVe}$ is expressed by $95 \geq d \geq 91$, $9 \geq e \geq 5$, $d+e=100$ in atom %.

5. A dielectric capacitor according to claim 1, wherein the adhesive layer includes at least one selected from a group including titanium (Ti), zirconium, hafnium, tantalum, niobium, chromium (Cr), molybdenum, and tungsten.

6. A dielectric capacitor according to claim 1, wherein the first electrode further includes another precious metal layer including at least one selected from the precious metal element group, which is provided between the dielectric film and the oxygen inclusion layer.

7. A dielectric capacitor according to claim 1, wherein the dielectric film is made of a ferroelectric including layer structure oxide containing bismuth (Bi).

8. A dielectric capacitor according to claim 1, wherein the dielectric film includes layer structure oxide made of at least one selected from a group consisting of bismuth, strontium (Sr), calcium (Ca) and barium (Ba), at least one selected from a group consisting of tantalum and niobium, and oxygen, and the composition formula of the layer structure oxide is expressed by $Bi_x (Sr, Ca, Ba)_y (Ta, Nb)_2 O_{9+z}$ and its composition range is $2.50 \geq x \geq 1.70$, $1.20 \geq y \geq 0.60$, $-1.00 \geq z \geq 1.00$ in mole ratio.

9. A dielectric capacitor according to claim 8, wherein the layer structure oxide is expressed by the composition formula, $Bi_x Sr_y Ta_2 O_{9+z}$, and its composition range is $2.50 \geq x \geq 1.70$, $1.20 \geq y \geq 0.60$, $-1.00 \geq z \geq 1.00$ in mole ratio.

10. A memory having a dielectric capacitor which is supported by a substrate portion and in which each of a first electrode and a second electrode is connected to a dielectric film, the first electrode comprising:

an oxygen inclusion layer including oxygen, which is provided between the substrate portion and the dielectric film, a precious metal layer including at least one selected from a precious metal element group consisting of platinum (Pt), iridium (Ir), ruthenium (Ru), rhodium (Rh) and palladium (Pd), which is provided between the oxygen inclusion layer and the substrate portion, and an adhesive layer provided between the precious metal layer and the substrate portion.

11. A memory according to claim 10, further comprising a transistor which is connected to the first electrode through a plug layer which comprises at least part of the substrate portion.

* * * * *